(12) United States Patent
Ishibashi et al.

(10) Patent No.: US 9,793,011 B2
(45) Date of Patent: Oct. 17, 2017

(54) STRUCTURE, ELECTRONIC ELEMENT MODULE, HEAT EXCHANGER, FUEL ROD, AND FUEL ASSEMBLY

(71) Applicant: Hitachi, Ltd., Chiyoda-ku, Tokyo (JP)

(72) Inventors: Ryou Ishibashi, Tokyo (JP); Takashi Naitou, Tokyo (JP); Motomune Kodama, Tokyo (JP); Takuya Aoyagi, Tokyo (JP); Tetsushi Hino, Tokyo (JP); Motoo Aoyama, Tokyo (JP); Tsuneyuki Hashimoto, Tokyo (JP); Katsuhito Takahashi, Tokyo (JP); Junichi Sakano, Tokyo (JP); Hiroshi Nakano, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 362 days.

(21) Appl. No.: 14/646,223

(22) PCT Filed: Nov. 21, 2012

(86) PCT No.: PCT/JP2012/080212
§ 371 (c)(1),
(2) Date: May 20, 2015

(87) PCT Pub. No.: WO2014/080482
PCT Pub. Date: May 30, 2014

(65) Prior Publication Data
US 2015/0318062 A1    Nov. 5, 2015

(51) Int. Cl.
*B32B 17/06* (2006.01)
*G21C 3/34* (2006.01)
(Continued)

(52) U.S. Cl.
CPC .......... *G21C 3/34* (2013.01); *C03C 8/14* (2013.01); *C03C 8/18* (2013.01); *C03C 8/24* (2013.01);
(Continued)

(58) Field of Classification Search
USPC .................................................. 428/426, 688
See application file for complete search history.

(56) References Cited

U.S. PATENT DOCUMENTS

| 5,434,896 A | 7/1995 | Bryan et al. |
| 6,586,087 B2 * | 7/2003 | Young .................... C03C 3/064 428/323 |

(Continued)

FOREIGN PATENT DOCUMENTS

| JP | 60-137848 A | 7/1985 |
| JP | 62-20143 B2 | 5/1987 |

(Continued)

OTHER PUBLICATIONS

International Search Report (PCT/ISA/210) dated Feb. 12, 2013 with English translation (six pages).

(Continued)

*Primary Examiner* — Lauren R Colgan
(74) *Attorney, Agent, or Firm* — Crowell & Moring LLP

(57) ABSTRACT

Provided is a structure including a first member (2); a second member (3) disposed opposite to the first member (2); and a glass layer (4) disposed between the first member (2) and the second member (3) so as to bond the first member (2) and the second member (3). A glass transition point of the glass layer (4) is lower than a temperature of the glass layer (4) under operation. In the glass layer (4), at least either of ceramic and metallic particles 4b, 4c is dispersed. In a temperature region lower than the glass transition point of the glass layer (4), a thermal expansion coefficient thereof (Continued)

falls in between thermal expansion coefficients of the first member (2) and the second member (3). This allows thermal strain caused within the structure (1) to be reduced when the structure (1) is operated at a higher temperature than a room temperature.

10 Claims, 8 Drawing Sheets

(51) Int. Cl.

| | | |
|---|---|---|
| *H05K 1/03* | (2006.01) | |
| *H05K 1/18* | (2006.01) | |
| *G21C 3/07* | (2006.01) | |
| *H05K 7/20* | (2006.01) | |
| *C03C 8/18* | (2006.01) | |
| *G21C 3/20* | (2006.01) | |
| *H01L 23/15* | (2006.01) | |
| *H01L 23/473* | (2006.01) | |
| *F28F 19/02* | (2006.01) | |
| *F28F 21/00* | (2006.01) | |
| *F28F 21/04* | (2006.01) | |
| *C03C 8/14* | (2006.01) | |
| *C03C 8/24* | (2006.01) | |
| *C04B 37/02* | (2006.01) | |
| *H01L 23/373* | (2006.01) | |
| *F28D 7/16* | (2006.01) | |

(52) U.S. Cl.
CPC ............ *C04B 37/025* (2013.01); *F28F 19/02* (2013.01); *F28F 21/006* (2013.01); *F28F 21/04* (2013.01); *G21C 3/07* (2013.01); *G21C 3/20* (2013.01); *H01L 23/15* (2013.01); *H01L 23/473* (2013.01); *H05K 1/0306* (2013.01); *H05K 1/18* (2013.01); *H05K 7/20509* (2013.01); *C04B 2237/10* (2013.01); *C04B 2237/365* (2013.01); *C04B 2237/38* (2013.01); *C04B 2237/403* (2013.01); *C04B 2237/405* (2013.01); *C04B 2237/407* (2013.01); *C04B 2237/765* (2013.01); *C04B 2237/84* (2013.01); *F28D 7/16* (2013.01); *F28F 2255/06* (2013.01); *H01L 23/3735* (2013.01); *H01L 2224/32225* (2013.01); *H01L 2224/48091* (2013.01); *H01L 2224/48227* (2013.01); *H01L 2224/48472* (2013.01); *H01L 2224/49109* (2013.01); *H01L 2224/73265* (2013.01); *H01L 2924/1305* (2013.01); *H01L 2924/13055* (2013.01); *H01L 2924/181* (2013.01); *Y02E 30/40* (2013.01)

(56) References Cited

U.S. PATENT DOCUMENTS

| | | | | |
|---|---|---|---|---|
| 7,927,705 | B2* | 4/2011 | Bayya | C03C 3/253 428/426 |
| 8,541,327 | B1* | 9/2013 | Lu | C03C 3/068 501/65 |
| 2004/0194507 | A1* | 10/2004 | Harris | C03C 17/02 65/31 |
| 2004/0207314 | A1* | 10/2004 | Aitken | C03C 3/072 313/504 |
| 2005/0277541 | A1* | 12/2005 | Yoshii | C03C 3/083 501/26 |
| 2006/0019813 | A1* | 1/2006 | Yoshii | C03C 8/02 501/15 |
| 2009/0205702 | A1* | 8/2009 | De Jong | H01L 31/0488 136/251 |
| 2009/0318278 | A1* | 12/2009 | Mayumi | C03C 3/068 501/32 |
| 2010/0129726 | A1* | 5/2010 | Tanida | C03C 3/087 429/479 |
| 2010/0180934 | A1* | 7/2010 | Naito | C03C 3/21 136/252 |
| 2012/0258241 | A1* | 10/2012 | Tucker | H01B 1/22 427/77 |
| 2014/0193643 | A1* | 7/2014 | Akhtar | B32B 17/06 428/428 |

FOREIGN PATENT DOCUMENTS

| | | |
|---|---|---|
| JP | 62-43938 B2 | 9/1987 |
| JP | 2-233532 A | 9/1990 |
| JP | 8-500187 A | 1/1996 |
| JP | 8-204302 A | 8/1996 |
| JP | 2867536 B2 | 3/1999 |
| JP | 2002-151810 A | 5/2002 |
| JP | 2002-308645 A | 10/2002 |
| JP | 2005-154246 A | 6/2005 |

OTHER PUBLICATIONS

Japanese-language Written Opinion (PCT/ISA/237) dated Feb. 12, 2013 (five pages).

Japanese-language International Preliminary Report on Patentability (PCT/IPEA/409) dated Oct. 8, 2013 (four pages).

\* cited by examiner

STRUCTURE, ELECTRONIC ELEMENT MODULE, HEAT EXCHANGER, FUEL ROD, AND FUEL ASSEMBLY

BACKGROUND OF THE INVENTION

Technical Field

The present invention relates to a structure, specifically, to an electronic element module, a heat exchanger, a fuel rod and a fuel assembly, each incorporated with the structure.

Background Art

As an example of the above structure, the following structure is proposed (in e.g., Patent Literature 1 below) in which a metallic thin film is formed on a glass layer disposed on a glazed substrate.

CITATION LIST

Patent Literature

Patent Literature 1: Japanese Patent Unexamined Application Publication No. Hei 8-204302

SUMMARY OF THE INVENTION

Technical Problems

According to the structure disclosed in Patent Literature 1, adhesiveness of the metallic thin film to the glazed substrate can be improved. However, when the above structure is operated at a higher temperature than a room temperature, there is concern that thermal strain occurs within the structure, leading to occurrence of peeling and the like of the metallic thin film.

Thus, an object of the present invention is to provide a structure allowing thermal strain generated within the structure to be reduced when the structure is operated at a higher temperature than a room temperature. Further, another object of the present invention is to provide an electronic element module, a heat exchanger, a fuel rod and a fuel assembly, each incorporated with the structure.

Solution to Problems

Herein, a glass transition point of the glass layer is lower than the temperature of the glass layer when the structure is iperated, and a softening point of the glass layer is higher than the temperature of the glass layer when the structure is operated. Further, the present invention includes an electronic element module, a heat exchanger, a fuel rod and a fuel assembly incorporated with the structure.

Advantageous Effects of the Invention

The present invention makes it possible to provide a structure that allows thermal strain generated within the structure to be reduced when the structure is operated at a higher temperature than a room temperature. Further, the present invention also makes it possible to provide an electronic element module, a heat exchanger, a fuel rod and fuel assembly allowing thermal strain generated within the structure to be reduced when operated at a higher temperature than normal room temperature. The technical problems, arrangements and advantageous effects other than noted above will be clarified through the explanations of the following embodiments.

EMBODIMENTS FOR CARRYING OUT THE INVENTION

Hereinafter, embodiments (and examples) of the present invention will be described in details with reference to the accompanying drawings where appropriate. Note that in the respective drawings, the components in common are represented with the same references and redundant explanations thereof are avoided. Further, the present invention is not limited to the plurality of specific embodiments (and examples) presented herein, and those embodiments (and examples) may well be combined where appropriate.

Figure 1:
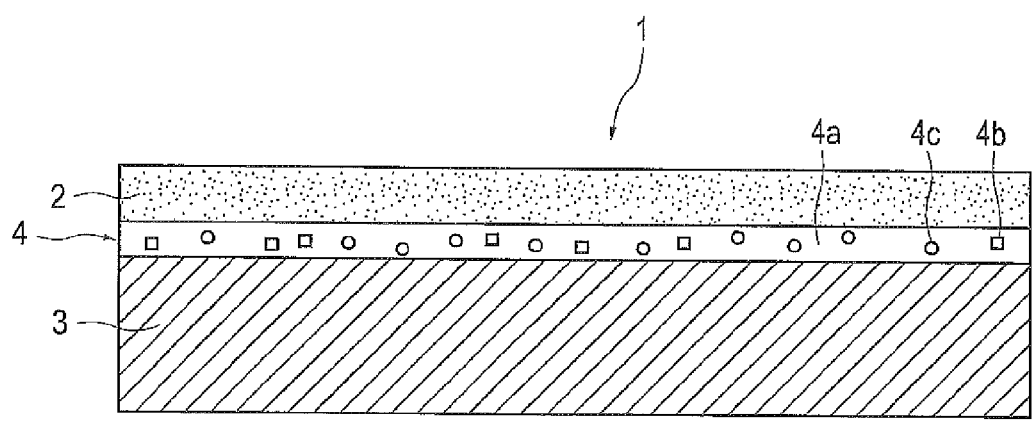
FIG. 1 is a cross-sectional view of a structure in an embodiment of the present invention.

FIG. 1 is a cross-sectional view of a structure 1 in an embodiment of the present invention. The structure 1 includes a first member (e.g., film) 2; a second member 3 disposed opposite to the first member 2; and a glass layer 4 disposed between the first and second members 2 and 3 so as to bond the first member 2 and the second member 3. The glass layer 4 is provided with a glass portion 4a forming a substrate; and a ceramic particle 4b and a metallic particle 4c dispersed in the glass portion 4a.

Figure 2:
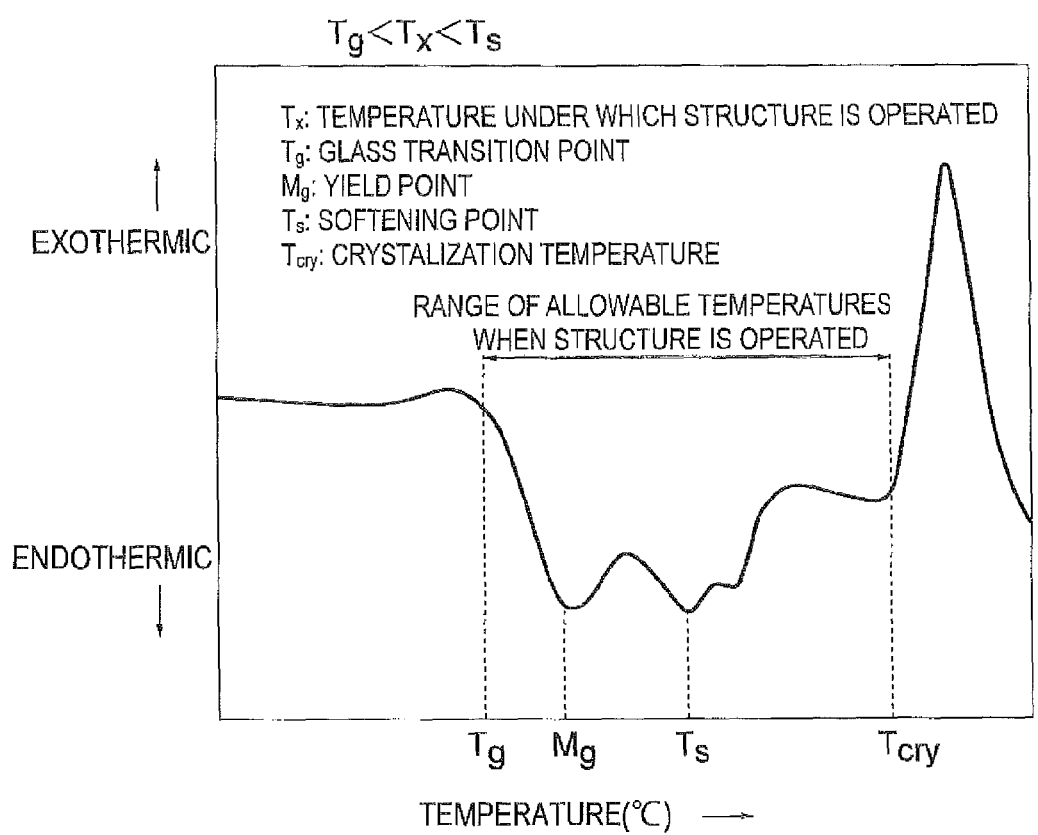
FIG. 2 is an example of a DTA (Differential Thermal Analysis) curve measured by DTA of a glass portion of a glass layer.

FIG. 2 shows an example of a DTA (Differential Thermal Analysis) curve measured by DTA of the glass portion 4a (i.e., in the glass layer 4). According to the differential thermal analysis exemplified herein, first, a part of the glass portion 4a is ground by a jet mill into powder so that an average particle size thereof results in being 3 μm or smaller. Then, such powder is subjected to the differential thermal analysis at a temperature rising rate of 5° C./minute. In this way, a DTA curve as shown in FIG. 2 is acquired. Based on the DTA curve, a glass transition point $T_g$, a yield point $M_g$, a softening point $T_s$ and a crystallization temperature $T_{cry}$ are determined (i.e., measured). Note that to a control sample, alumina ($Al_2O_3$) powder is applied.

As shown in FIG. 2, the transition point (i.e., glass transition point) $T_g$ is calculated by a tangent method, which is defined as a starting temperature of the first endothermic peak. The yield point $M_g$ is calculated by a tangent method, which is defined as a peak temperature of the first endothermic peak. The softening point $T_s$ is calculated by a tangent method, which is defined as a peak temperature of the second endothermic peak. The crystallization temperature $T_{cry}$ is calculated by a tangent method, which is defined as a starting temperature of the exothermic peak caused by the crystallization process.

Further, the characteristic temperatures (i.e., transition point $T_g$, yield point $M_g$, softening point $T_s$) of the glass portion 4a (i.e., in the glass layer 4) are defined by viscosity of the glass. Herein, the transition point $T_g$, the yield point $M_g$ and the softening point $T_s$ correspond to the temperatures at which values of the viscosity of the glass may become $10^{13.3}$ poise, $10^{11.0}$ poise and $10^{7.65}$ poise respectively. The crystallization temperature $T_{cry}$ is a temperature at which the glass portion 4a (i.e., in the glass layer 4) starts to be crystallized. In order to secure the bond strength of the glass portion 4a (i.e., in the glass layer 4) without softening the glass portion 4a to raise the fluidity at the temperature $T_x$ of the glass layer 4 when the structure 1 is operated, the softening point $T_s$ has only to be higher than the temperature $T_x$ of the glass layer 4 when the structure 1 is operated.

Moreover, in order to reduce thermal residual strain, the transition point $T_g$ has to be lower than the temperature $T_x$ of the glass layer 4 when the structure 1 is operated. Accordingly, the temperature $T_x$ of the glass layer 4 when the structure 1 is operated falls within the allowable temperature range ($T_g \leq T_x \leq T_s$) such that the temperature $T_x$ is equal to the transition point $T_g$ or higher while is equal to the softening point $T_s$ or lower. This arrangement, even when thermal strain occurs within the structure when it is operated at a higher temperature than a room temperature, allows such strain to be reduced.

Furthermore, this may prevent the first and second members 2 and 3 from causing peel-off of the bonded surfaces thereof and from being fractured owing to the thermal strain. Further, the reduction of the thermal strain may also prevent the fatigue fracture of the structure 1 from happening, allowing the durability of structure to be enhanced.

The first member 2 shown in FIG. 1 may well be a film formed on the glass layer 4. The filmy first member 2 can be formed thereon through such coating methods as a sputtering method, a vapor deposition method, a plating method and a coating method. Note that even when the first member 2 is formed after the formation of the glass layer 4, the states just after the first member 2 and glass layer 4 are formed and the states when and after the structure 1 is operated are under the conditions that the glass layer 4 is bonded to the first member 2. The first and second members 2 and 3 are bonded to each other through the glass layer 4, thereby to form a laminated structure of three layers including the first member 2, the glass layer 4 and the second member 3.

Further, as shown in FIG. 1, an apparent thermal expansion coefficient of the glass layer 4 can be increased or decreased by dispersing a ceramic particle 4b and a metallic particle 4c in the glass layer 4. That is to say, incorporating in the glass layer 4 a ceramic particle 4b and a metallic particle 4c having a larger thermal expansion coefficient than the net thermal expansion coefficient of the glass portion 4a of the glass layer 4 permits the apparent thermal expansion coefficient of the glass layer 4 to be increased. On the contrary, incorporating in the glass layer 4 a ceramic particle 4b and a metallic particle 4c having a smaller thermal expansion coefficient than the net thermal expansion coefficient of the glass portion 4a permits the apparent thermal expansion coefficient of the glass layer 4 to be decreased.

Here, in the temperature region lower than the transition point $T_g$, the apparent thermal expansion coefficient of the glass layer 4 is adjusted at a value between the thermal expansion coefficients of the first and second members 2 and 3. This adjustment permits thermal strain generated on the bonded surfaces of the first and second members 2 and 3 even in the temperature region lower than the transition point $T_g$ to be smaller than thermal strain generated when those members 2 and 3 are directly bonded to each other. Further, not only the apparent thermal expansion coefficient of the glass layer 4 but also the apparent thermal conductivity and electrical conductivity thereof can be controlled by dispersing a ceramic particle 4b and a metallic particle 4c in the glass layer 4.

To the ceramic particle (i.e., ceramic filler) 4b, ceramic powder (or particle) having a lower thermal expansion coefficient is applied in order to reduce the apparent thermal expansion coefficient of the glass layer 4. To the ceramic particle 4b having a lower thermal expansion coefficient, for example, zirconium phosphate tungstate $(Zr_2(WO_4)(PO_4)_2)$, $LiAlSiO_4$ and so forth are applied. However, just if the apparent thermal expansion coefficient of the glass layer 4 is decreased under the consideration of the applied environment and the reaction with the glass portion 4a, any ceramic particle 4b may be selected. Note that a size of the ceramic particle 4b is smaller than a thickness of the glass layer 4 in which such a particle is added.

The metallic particle (i.e., metallic filler) 4c is used for increasing especially the apparent thermal conductivity and electrical conductivity of the glass layer 4. To a material of the metallic particle 4c, for example, Au, Ag, Cu and the like are applied. However, just if the apparent thermal conductivity and electrical conductivity of the glass layer 4 are increased under consideration of the applied environment and the reaction with the glass portion 4a, any metallic particle 4c may be selected. Note that a size of the metallic particle 4c is smaller than a thickness of the glass layer 4 in which such a particle is added.

Here, adding the metallic particle 4c in the glass layer changes not only the thermal conductivity and the electrical conductivity of the glass layer 4, but also the apparent thermal expansion coefficient of the glass layer 4c. Thus, both the ceramic particle 4b and the metallic particle 4c are added in the glass layer 4 in order to set the two or three characteristic values among the thermal conductivity, electrical conductivity and thermal expansion coefficient of the glass layer 4 at desired values, respectively.

However, when too much amounts of the ceramic particle 4b and metallic particle 4c are added, the bond strength of the glass layer 4 to the first and second members 2 and 3 deteriorates. In this regard, the amounts of the added particles are designed under consideration of the required thermal expansion coefficient, thermal conductivity and electrical conductivity of the glass layer.

Further, a material of the glass portion 4a of the glass layer 4 is appropriately selected corresponding to the materials of the first and second members 2 and 3 to which the glass layer 4 is bonded and a temperature of the glass layer 4 when the structure 1 is operated. The temperature of the glass layer 4 is determined corresponding to the temperature at which the structure 1 is operated. Such an appropriate selection thereof secures wettability and adhesive properties of the glass layer for the materials of both the first and second members 2 and 3 to be bonded by the glass layer. Eventually, this enables the thermal strain of the structure 1 to be reduced at the temperature when the structure 1 is operated (i.e., at the temperature of the glass layer 4 when the structure 1 is operated).

Next, examples of the glass (i.e., glass materials) adoptable to the glass portion 4a of the glass layer 4 are shown in Table 2. The column of glass transition point $T_g$ shown in Table 2 lists a settable and adjustable temperature range covered by the glass transition point $T_g$ per glass material. For instance, when applying a PbO—$B_2O_3$ based glass material to the material of the glass portion 4a, a transition point $T_g$ thereof can be set and adjusted within the temperature range of 250 to 350° C. via adjusting the glass components and so forth.

Hereby, such a glass transition point $T_g$ can be set and adjusted at a desired temperature, for example, ranging up to substantially 850° C. at the maximum from substantially 150° C. at the minimum by selecting a material of the glass portion 4a among the plural types of the glass shown in Table 2.

More specifically, a material (i.e., glass material) of the glass portion 4a of the glass layer 4 may include a PbO—$B_2O_3$ based glass material; a $Bi_2O_3$—$B_2O_3$ based glass material; a $Na_2O$—BaO—$SiO_2$ based glass material; an $Al_2O_3$—$B_2O_3$—$SiO_2$ based glass material; a $Na_2O$—$Al_2O_3$—$B_2O_3$—$SiO_2$ based glass material; a $Na_2O$—$Al_2O_3$—$B_2O_3$—ZnO—$SiO_2$ based glass material; a PbO—ZnO—$B_2O_3$ based glass material; a PbO—$Al_2O_3$—$SiO_2$ based glass material; a PbO—$B_2O_3$—$Al_2O_3$—$SiO_2$ based glass material; a PbO—ZnO—$B_2O_3$—$SiO_2$ based glass material; a ZnO—$B_2O_3$—$SiO_2$ based glass material; a $V_2O_5$—$P_2O_5$—$Sb_2O_3$—BaO based glass material; a $V_2O_5$—$P_2O_5$—BaO—MnO—$Fe_2O_3$—$WO_3$—$Na_2O$—$K_2O$ based glass material; a $V_2O_5$—$P_2O_5$—$TeO_2$—$Fe_2O_3$ based glass material; a $V_2O_5$—$P_2O_5$—BaO—$TeO_2$—$Fe_2O_3$—$WO_3$ based glass material; a $V_2O_5$—$P_2O_5$—BaO—$TeO_2$—$Fe_2O_3$—$WO_3$—$K_2O$ based glass material; and a $V_2O_5$—$TeO_2$—$Ag_2O$ based glass material.

With respect to those glass materials, the glass transition points $T_g$ fall in the temperature range from substantially 150° C. to substantially 850° C. Thus, a relatively lower temperature can be set and adjusted as a glass transition point of the applied material. This allows a glass transition point $T_g$ of the applied material to be set lower than the temperature at which the structure 1 is operated (i.e., at the temperature of the glass layer 4 when the structure 1 is operated). In Table 2 listed are the temperature ranges of the glass transition points $T_g$ of the respective glass materials.

Here, a material of the glass portion 4a of the glass layer 4 are selected from the glass materials each of which has a glass transition point $T_g$ lower than the temperature at which the structure 1 is operated, and high bond strength with the first member 2 and the second member 3 to be bonded to the glass layer. With respect to those glass materials, bond strength of each glass material differs according to the types of the materials of the first member 2 and the second member 3 to be bonded to the glass layer. In this regard, optimal combination between the glass material of the glass portion 4a and the materials of the first member 2 and the second member 3 to be adhered to the glass layer may achieve high bond strength.

For examples, the PbO—$B_2O_3$ based glass material shows high bond strength to materials to be bonded such as alumina, aluminum nitride (ALN), mullite and silicon (Si).

The $Bi_2O_3$—$B_2O_3$ based glass material shows high bond strength to materials to be bonded such as aluminum nitride, mullite and silicon.

The $Na_2O$—$Al_2O_3$—$B_2O_3$—ZnO—$SiO_2$ based glass material shows high bond strength to materials to be bonded such as alumina and silicon nitride (SiN).

The PbO—ZnO—$B_2O_3$—$SiO_2$ based glass material shows high bond strength to materials to be bonded such as silicon carbide (SiC).

The $V_2O_5$—$P_2O_5$—$Sb_2O_3$—BaO based glass material; $V_2O_5$—$P_2O_5$—BaO—MnO—$Fe_2O_3$—$WO_3$—$Na_2O$—$K_2O$ based glass material; $V_2O_5$—$P_2O_5$—$TeO_2$—$Fe_2O_3$ based glass material; $V_2O_5$—$P_2O_5$—BaO—$TeO_2$—$Fe_2O_3$—$WO_3$ based glass material; and $V_2O_5$—$P_2O_5$—BaO—$TeO_2$—$Fe_2O_3$—$WO_3$—$K_2O$ based glass material show high bond strength to materials to be bonded such as alumina, silicon and silicon carbide.

As shown in FIG. 1, the structure 1 has a structural arrangement such that the first and second members 2 and 3 are bonded to each other through the glass layer 4. Herein, use of different materials for the first and second members 2 and 3 may provide a structure in which the two members made of the different materials are bonded via the glass layer 4. The materials of the first and second materials 2 and 3 include ceramics such as alumina, silicon nitride and silicon carbide, glass, semiconductors such as silicon, metals such as molybdenum, tungsten, copper, aluminum, steel materials, titanium, zirconium, stainless steel and their alloys. Further, metal-ceramic composites such as Al—SiC and ceramic fibers/ceramic matrix composites such as SiC/SiC composite materials are also adoptable to the materials of the first and second members 2 and 3.

In Table 1, thermal expansion coefficients of various materials are exemplified. The thermal expansion coefficients of metals and alloys are widely distributed. Aluminum, brass, copper, gold and austenitic stainless steel show a higher thermal expansion coefficient. On the other hand, tungsten, molybdenum, zirconium show a lower thermal expansion coefficient. According to Table 1, silicon and diamond are classified into the group of materials having the lowest thermal expansion coefficient. The thermal expansion coefficients of ceramics such as alumina, silicon carbide, aluminum nitride and silicon nitride are within the range of 3.5 to $8.5 \times 10^{-6}$/K.

Next, a case that different types of materials with different thermal expansion coefficients are applied to the first and second members 2 and 3 will be discussed. The first and second members 2 and 3 are bonded to each other through the glass layer 4. Providing that a difference between the thermal expansion coefficients of the first and second members 2 and 3 is defined as $\Delta\alpha$ and a temperature change from a room temperature to a temperature of the structure 1 under operation is defined as $\Delta T$, thermal strain $\Delta\epsilon$ calculated by the equation $\Delta\epsilon = \Delta\alpha \cdot \Delta T$ occurs on the interface. For instance, provided that the first member 2 is made of alumina while the second member 3 is made of copper, a difference between the thermal expansion coefficients of those members $\Delta\alpha$ is about $10 \times 10^{-6}$/K. Further, provided that a temperature change $\Delta T$ is 100 K, a thermal strain $\Delta\epsilon$ of $1 \times 10^{-3}$ is generated.

However, the transition point (i.e., glass transition point) $T_g$ of the glass portion 4a of the glass layer 4 is set lower than the temperature of the structure 1 under operation (i.e., at the temperature of the glass layer 4 when the structure is operated). This setting causes the thermal strain $\Delta\epsilon$ generated in a heating process to disappear due to plastic fluidization of the glass when the temperature of the structure under operation becomes higher than the transition point $T_g$. Herein, it should be noted that strictly speaking, the first and second members 2 and 3 are not fixed to each other since the temperature under operation is higher than the transition point $T_g$. However, the bond strength of the glass layer 4 prevents the first and second members from peeling off.

The glass layer 4 is made to have fluidity such that the peeling force does not occur on either of the first and second members 2 and 3. On the contrary, when the structure is cooled down to the transition point $T_g$ or lower during a cooling process, thermal strain $\Delta\epsilon$ occurs in the structure.

Specifically, when operation of the structure 1 is switched from an operating state to a halting state, a temperature change ΔT occurs from the transition point $T_g$ to a room temperature, so that during the cooling process the thermal strain Δϵ is generated corresponding to the temperature change ΔT. However, such thermal strain Δϵ in the cooling process is restrictive to be generated only when the structure is in the halting state. Further, since the transition point $T_g$ is set lower, the thermal strain Δϵ in the cooling process results in being smaller. From the viewpoints as mentioned above, in order to reduce the thermal strain Δϵ in the cooling process, the apparent thermal expansion coefficient of the glass layer 4 is set at a value between the thermal expansion coefficients of both the first and second members 2 and 3.

Note that the same material may well be applied to the first and second members 2 and 3. In this case, since the thermal expansion coefficients of the first and second members 2 and 3 are equal to each other, it is seemingly supposed that no thermal strain Δϵ is generated on the interface. However, thermal strain Δϵ is generated when a temperature gradient occurs in the structure 1 under operation or when the bonded surfaces of the first and second members 2 and 3 are not planar but curved.

If a temperature gradient occurs in the structure 1 under operation, it is supposed that there are differences among a temperature of the structure 1 under operation, a temperature of the first member 2 of the structure 1 under operation, a temperature of the second member 3 when the structure 1 is operated, and a temperature of the glass layer 4 when the structure 1 is operated. Thus, a temperature difference occurs between the first and second members 2 and 3, thereby to cause thermal strain Δϵ on the interface. Further, a temperature difference also occurs between the temperature of the structure 1 under operation and the temperature of the glass layer 4 when the structure 1 is operated. Under the above conditions, in order to reduce the generating thermal strain Δϵ, a glass material of the glass portion 4a is required to be selected such that a temperature of the glass layer 4 when the structure 1 is operated instead of a temperature of the structure 1 under operation, is higher than the transition point $T_g$ of the glass portion 4a.

Note that no temperature gradient or a slight temperature gradient if any occurs in a general structure 1. Therefore, it is likely that the temperature of the glass layer 4 when the structure 1 is operated is substantially the same as the temperature of the structure 1 under operation. Further, also when the bonded surfaces of the first and second members 2 and 3 are not planar, thermal strain Δϵ is generated on the interface, but such strain is reduced by the glass layer 4.

Hereinafter, a method for producing the structure 1 will be explained. To begin with, a glass material having a transition point $T_g$ lower than the temperature of the structure 1 under operation and strong bond strength with the materials of the first member 2 and the second member 3 to be bonded to the glass layer is selected.

Then, the selected glass material (i.e., glass portion 4a) is produced. In the production of the glass material, first, glass raw materials are prepared to have a predetermined composition. Next, the prepared glass raw materials are mixed and the mixture is fused and then slowly cooled or left to be cooled, whereby an agglomerate of the glass material is formed. Subsequently, the agglomerate of the glass material is grounded to produce powder of the glass material.

Then, the blending amounts of the ceramic particle (i.e., ceramic filler) 4b and the metallic particle (i.e., metallic filler) 4c are designed and measured such that the apparent thermal expansion coefficient, the apparent thermal conductivity and the apparent electrical conductivity of the glass layer 4 result in predetermined values, respectively. The measured ceramic particle 4b and metallic particle 4c are blended with the powder of the glass material. An organic compound is mixed with the blended material so as to prepare a glass paste.

Thereafter, the resulting glass paste is coated on a surface of one of the first and second members 2 and 3, for instance, on a surface of the second member 3. The coating method includes screen printing, spray coating, dip coating, spin coating and so forth. A coated film thus formed is dried so as to remove the organic compound from the film.

Subsequently, the coated film is fired so as to raise a temperature of the powder of the glass material to the softening point $T_s$ or higher. The powder of the glass material is softened and integrated (i.e., becomes bulk), whereby the glass layer 4 is completed. Further, the firing step renders the glass layer 4 bonded to the surface of the second member 3 on which the glass paste has been coated.

Next, the other first member 2 to be bonded to the glass layer is formed. As a forming method of the first member 2, the following two methods are adoptable.

The first forming method is conducted by the steps of placing the first member 2 on the glass layer 4; pressing the first member 2 onto the glass layer 4 via adjusting a thickness of the glass layer 4; heating the glass layer 4 to raise a temperature thereof to the softening point $T_s$ or higher with keeping the pressing state; and bonding the first member 2 and the glass layer 4. For example, this forming method is applied to formation of the structure 1 of an electronic element module and the like. Herein, a wiring circuit board (or substrate) and an electronic element (or element) are bonded to each other via a glass layer, the writing circuit board and the electronic element being respectively manufactured at different processes. Accordingly, the structure 1 is completed.

The other forming method is conducted by the step of forming the first member 2 on the glass layer 4 through a coating process. For instance, this coating process is applied to forming a coating layer or a circuit layer (i.e., wiring layer) as the first member 2. The coating process includes a sputtering method, a vapor deposition method, an electroplating method, an electroless plating method and a coating method via paste coating and firing. Accordingly, the structure 1 is completed.

EXAMPLES

Hereinafter, referring to a plurality of examples, various types of products incorporated with the structure 1 will be explained in detail.

Example 1

Figure 3:
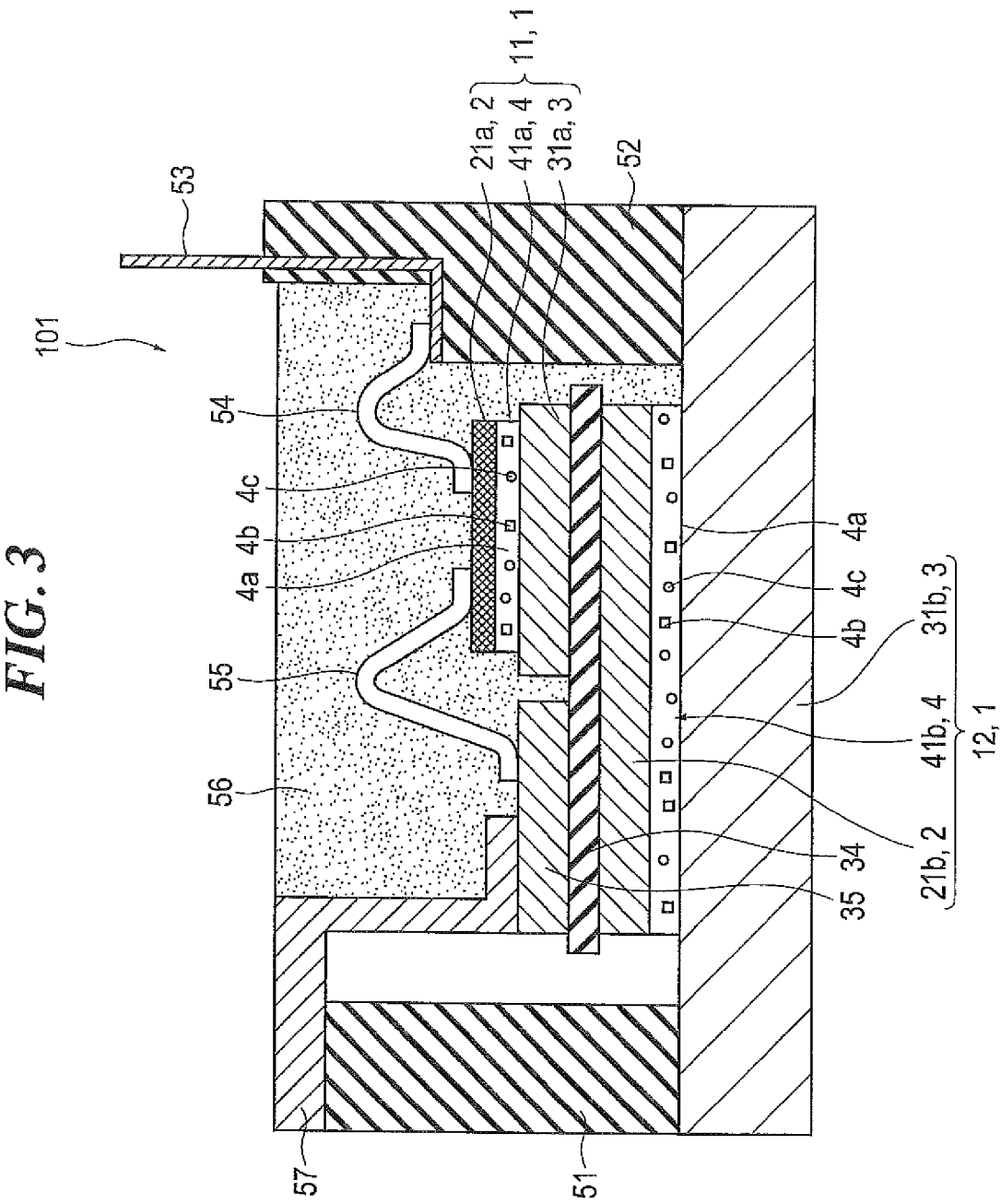
FIG. 3 is a cross-sectional view of an electronic element module in Example 1 of the present invention.

FIG. 3 shows a cross-sectional view of an electronic element module 101 in Example 1 of the present invention. In Example 1, as a product incorporated with the structure 1, the electronic element module 101 is described. More specifically, in FIG. 3, an IGBT (Insulated Gate Bipolar Transistor) module is shown as an example of the electronic element module 101. The electronic element module 101 includes a heat dissipating substrate 31b; laminated substrates (31a, 21b, 34, 35); and an electronic element 21a. The heat dissipating substrate 31b is made of a material such as Cu, Mo and an Al—SiC composite. On the heat dissipating substrate 31b, insulating terminal blocks 51 and 52 are fixed. On an upper part of the terminal block 51, a main electrode 57 is extended and fixed. On an upper part of the terminal block 52, a control electrode 53 is extended and fixed.

The main electrode 57 is connected through a wiring circuit board 35 and a lead wire 55 to the electronic element 21*a*. The control electrode 53 is connected through a lead wire 54 to the electronic element 21*a*. The electronic element 21*a* and so forth are sealed with a sealant 56. The electronic element 21*a* (i.e., first element 2) is bonded through the glass layer 41*a* (i.e., 4) to the wiring circuit board 31*a* (i.e., second member 3). Hence, it is supposed that the structure 1 explained in the above examples is realized by the laminated structure of the electronic element 21*a* (i.e., first member 2), the glass layer 41*a* (i.e., 4) and the wiring circuit board 31*a* (i.e., second member 3). The laminated structure of the electronic element 21*a* (i.e., first member 2), the glass layer 41*a* (i.e., 4) and the wiring circuit board 31*a* (i.e., second member 3) forms a smaller structure 11 (i.e., structure 1) of the electronic element module 101.

The wiring circuit boards 31*a* and 35 are provided on the insulating substrate 34. Below the insulating substrate 34, the wiring circuit board 21*b* is provided. These wiring circuit boards 31*a* and 35, the insulating substrate 34 and the wiring circuit board 21*b* construct a three-layered laminated substrate (31*a*, 21*b*, 34, 35). The wiring circuit board 21*b* (i.e., first member 2) is bonded to the heat dissipating substrate 31*b* (i.e., second member 3) via the glass layer 41*b* (4). Thereby, it is supposed that the structure 1 explained in the embodiments of the present invention is realized by the laminated structure of the wiring circuit board 21*b* (i.e., first member 2), the glass layer 41*b* (i.e., 4) and the heat dissipating substrate 31*b* (i.e., second member 3).

The laminated structure of the wiring circuit board 21*b* (i.e., first member 2), the glass layer 41*b* (i.e., 4) and the heat dissipating substrate 31*b* (i.e., second member 3) forms a larger structure 12 (i.e., structure 1) of the electronic element module 101. The laminated structure of the wiring circuit board 21*b* (i.e., first member 2), the glass layer 41*b* (i.e., 4) and the heat dissipating substrate 31*b* (i.e., second member 3) also works as a support member to support the electronic element 21*a*.

In the electronic element module 101, the operated temperature thereof reaches, for example, substantially 200° C. by the heating-up of the electronic element 21*a* and the wiring circuit boards 31*a*, 21*b* and 35. Hence it is supposed that the operated temperatures of the smaller structure 11 (i.e., structure 1) and the larger structure 12 (i.e., structure 1) also reach, for example, substantially 200° C. Further, it is supposed that the temperatures of the glass layers 41*a* and 41*b* (i.e., 4) when the electronic element module 101 is operated also reach, for example, substantially 200° C.

Thus, to a glass material of the glass portions 4*a* of the glass layers 41*a* and 41*b* (i.e., 4), a $V_2O_5$—$TeO_2$—$Ag_2O$ based glass material (refer to the column of $V_2O_5$—$TeO_2$—$Ag_2O$ based glass material in Table 2) is applied, which has a transition point (i.e., glass transition point) $T_g$ of substantially 150° C. lower than the operated temperature of substantially 200° C.

Further, in the glass layers 41*a* and 41*b* (i.e., 4), the metallic particle 4*c* made of Ag and the ceramic particle 4*b* are dispersed. Thereby, the apparent thermal conductivity of the glass layers 41*a* and 41*b* (i.e., 4) are respectively set at 25 W/mK or higher. Moreover, in order to set the electric resistance of the glass layers 41*a* and 41*b* (i.e., 4) is 0.1 mΩ/cm² or lower, apparent electrical resistivity thereof is adjusted by an added amount of the metallic particle 4*c*, and thicknesses of the glass layers 41*a* and 41*b* (i.e., 4) are adjusted, respectively.

Furthermore, a thermal expansion coefficient of the glass layer 41*a* is set to have a value not only between those of the electronic element 21*a* and the wiring circuit board 31*a* but also between those of the wiring circuit board 21*b* and the heat dissipation substrate 31*b*, by adjusting added amounts of the metallic particle 4*c* and the ceramic particle 4*b*. The above setting allows electric conductivity and heat dissipation required for operating the electronic element 21*a* to be maintained, and prevents the bonded portions from being fractured through a thermal cycle.

Note that any electronic element 21*a*, not limited to IGBT, always generates heat during the operation. Herein, the structure of Example 1 is applicable to any electronic element 21*a* if generating heat, for example, a light emitting diode (LED), a semiconductor laser, and a transistor, an LSI chip, allowing the same effects as in Example 1 to be achieved. Especially, in a light emitting diode with high output power, it is supposed that a rise in the operated temperature associated with the high output power operation causes large thermal strain at the bonded portion between the light emitting diode (i.e., electronic element 21*a*) and the substrate, so that such bonded portion is vulnerable to fatigue fracture.

However, using the glass layer 41*a* (i.e., 4) for the bonded portion suppresses fracture thereof. Note that corresponding to the thermal expansion coefficient of the light emitting diode (i.e., electronic element 21*a*), added amounts of the ceramic particle 4*b* and the metallic particle 4*c* to the glass layer 41*a* (i.e., 4) are fine-tuned so that the apparent thermal expansion coefficient of the glass layer 41*a* (4) has a value between those of the light emitting diode (electronic element 21*a*) and the substrate.

Example 2

Figure 4:
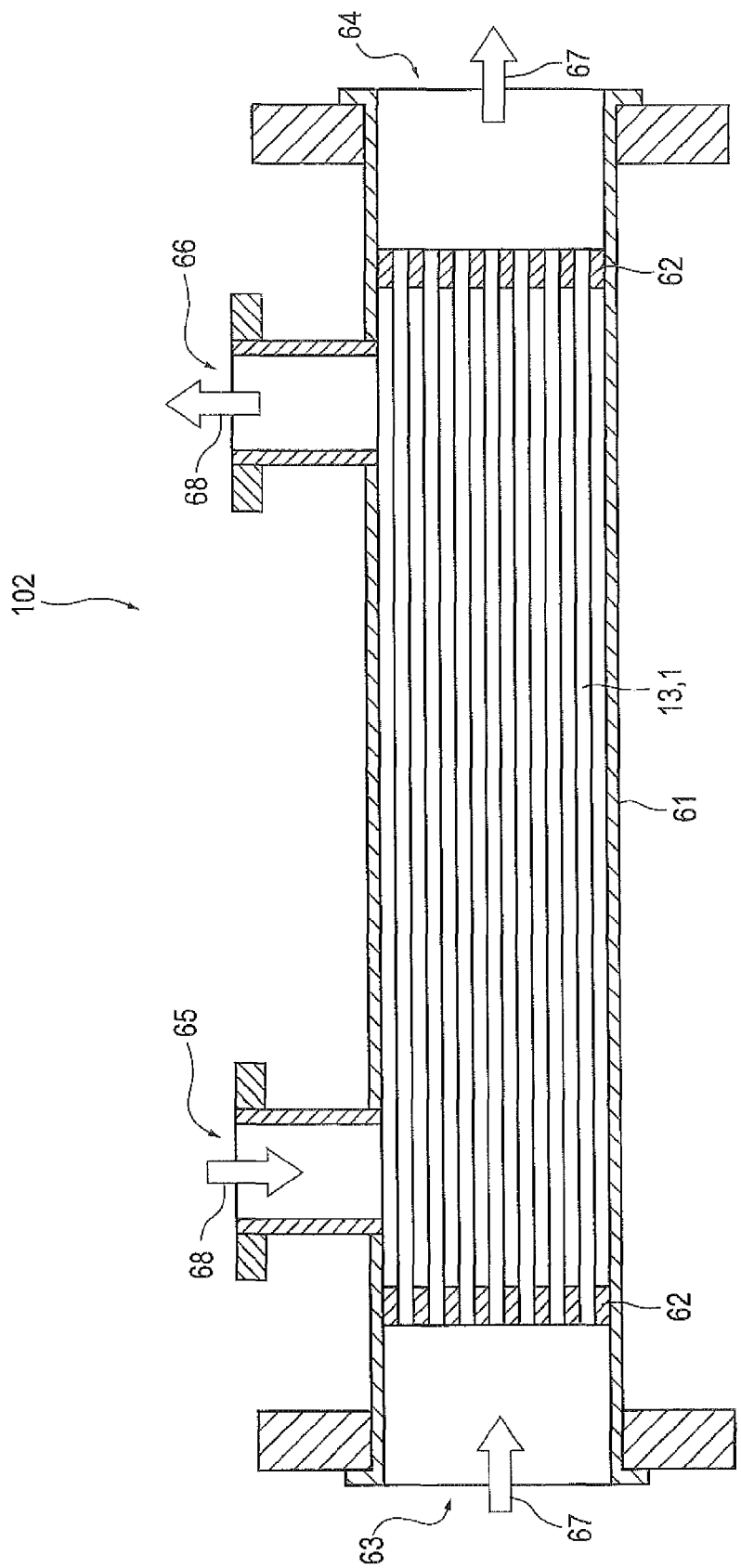
FIG. 4 is a cross-sectional view of a heat exchanger in Example 2 of the present invention.

FIG. 4 shows a cross-sectional view of a heat exchanger 102 in Example 2 of the present invention. In Example 2, the heat exchanger 102 is described as a product incorporated with the structure 1. Here, in FIG. 4, a cylindrical multi-tubular heat exchanger is shown as an example of the heat exchanger 102. The heat exchanger 102 includes a cylindrical body 61 having openings 63 and 64 at both ends thereof. Further, two openings 65 and 66 are formed also on the side surface of the body 61. The inside of the body 61 is closed at both sides by two tube plates 62. Inside the closed body 61, a plurality of heat transfer tubes 13 are disposed. The heat transfer tubes 13 extend from one of the tube plates 62 to the other tube plate 62 and penetrate through the respective tube plates 62.

In the heat exchanger 102, a high temperature fluid 67 such as a combustion gas, a high temperature vapor and a high temperature liquid flows therein from the opening 63. The fluid 67 heats the heat transfer tubes 13 while passing through the inner sides of the heat transfer tubes 13 and discharges heat therefrom. Then, the fluid 67 flows out from the opening 64. On the other hand, a fluid 68 such as water to act as a heating medium flows in the heat exchanger 102 from the opening 65. The fluid 68 deprives the heat transfer tubes 13 of heat while passing through the outer sides of the heat transfer tubes 13 as well as the inner side of the body 61, resulting in a temperature rise of the fluid 68. Then, the fluid 68 flows out from the opening 66.

In this way, the heat exchange 102 permits fluids 68 (i.e., first fluid) and 67 (i.e., second fluid) different from each other in temperature to flow as separated each other by the heat transfer tubes 13 (i.e., structures 1). Then, heat inherent in the fluid 67 can be transferred to the fluid 68 through the heat transfer tubes 13. As mentioned above, it should be noted that the structure 1 explained in the embodiments of the present invention is realized in the heat transfer tubes 13 (i.e., structures 1).

Figure 5:
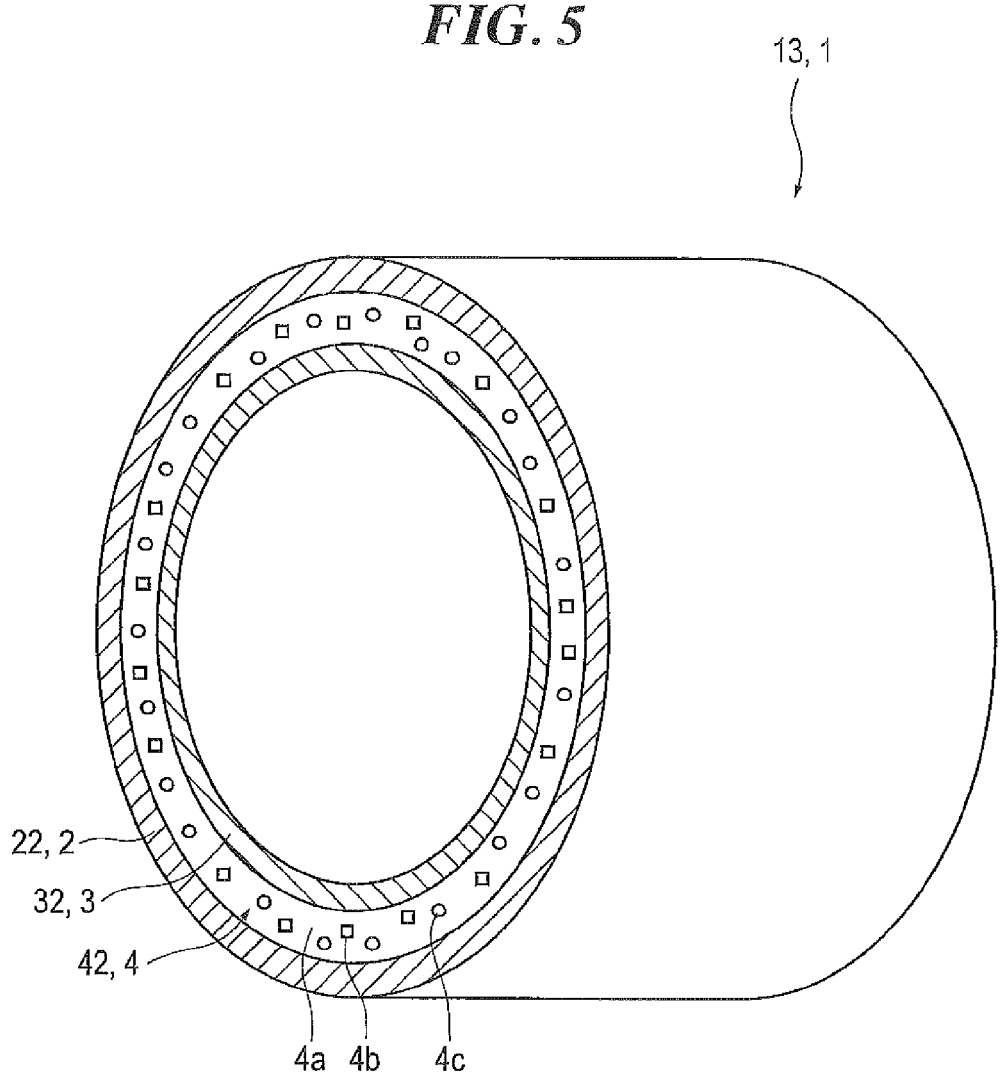
FIG. 5 is a cross-sectional perspective view of a heat transfer tube (i.e., structure) included in the heat exchanger in Example 2 of the present invention.

FIG. 5 shows a cross-sectional perspective view of the heat transfer tube 13 (i.e., structure 1) used in the heat exchanger 102 in Example 2 of the present invention. The heat transfer tube 13 (i.e., structure 1) includes a cylindrical outer tube 22 (i.e., first member 2); a cylindrical inner tube 32 (i.e., second member 3) disposed on the inner side of the outer tube 22 (i.e., first member 2); and a glass layer 42 (i.e., 4) to bond the inner wall of the outer tube 22 (i.e., first member 2) to the outer wall of the inner tube 32 (i.e., second member 3).

Thereby, the structure 1 explained in the embodiments of the present invention is realized in the laminated structure formed of the outer tube 22 (i.e., first member 2), the glass layer 42 (i.e., 4) and the inner tube 32 (i.e., second member 3). In other words, the heat transfer tube 13 (i.e., structure 1) including such laminated structure realizes the structure 1 explained in the embodiments of the present invention.

The outer tube 22 (i.e., first member 2) is disposed on the glass layer 42 (i.e., 4) at the side of the fluid (i.e., first fluid) 68 such as water working as a heating medium. Thus, the outer tube 22 should have corrosion resistance against the fluid (i.e., first fluid) 68 such as water working as a heating medium.

On the other hand, the inner tube 32 (i.e., second member 3) is disposed on the glass layer 42 (i.e., 4) at the side of the fluid (i.e., second fluid) 67 having a high temperature and high corrosiveness, for example, a combustion gas, a high temperature vapor and a high temperature liquid. Thus, the inner tube 32 (i.e., second member 3) should be made of an alloy tube or a ceramic tube having highly corrosion resistance. Alternately, an alloy layer or a ceramic coating layer having highly corrosion resistance should be used for the inner tube 32 (i.e., second member 3).

When the heat exchanger 102 is operated, heat is constantly conducted from the inner tube 32 (i.e., second member 3) to the outer tube 22 (i.e., first member 2) in the heat transfer tube 13 (i.e., structure 1). Thus, temperature gradient may be generated in the heat transfer tube 13 (i.e., structure 1). For this reason, the temperature of the glass layer 42 (i.e., 4) during the operation of the heat exchanger 102 (i.e., heat transfer tube 13, structure 1) is estimated based on the temperatures and so forth of the fluid (i.e., first fluid) 68 and the fluid (i.e., second fluid) 67. A glass material having a lower transition point $T_g$ than the temperature of the glass layer 42 (i.e., 4) during the operation of the heat exchanger 102 is applied to the material of the glass portion 4a of the glass layer 42 (i.e., 4). More specifically, when a combustion gas temperature (i.e., temperature of the fluid 67 (i.e., second fluid)) is substantially 500° C., the temperature of the glass layer 42 (i.e., 4) during the operation of the heat exchanger is estimated to be substantially 500° C.

Accordingly, the glass material is selected from, for example, $Na_2O$—$BaO$—$SiO_2$ based glass materials, $Al_2O_3$—$B_2O_3$—$SiO_2$ based glass materials, $Na_2O$—$Al_2O_3$—$B_2O_3$—$SiO_2$ based glass materials, $PbO$—$B_2O_3$—$Al_2O_3$—$SiO_2$ based glass materials (refer to the respective corresponding columns in Table 2) whose transition points (i.e., glass transition points) $T_g$ are substantially equal to 500° C. or lower.

Further, the glass layer 42 (i.e., 4) used in the heat transfer tube 13 is required to have high thermal conductivity so as to easily conduct heat. Thus, the metallic particle 4c and the ceramic particle 4b are dispersed in the glass layer 42 (i.e., 4) so that the apparent thermal conductivity of the glass layer is equal to 22 W/mK or higher. Moreover, the apparent thermal expansion coefficient of the glass layer 42 (i.e., 4) is set to have a value between those of the inner tube 32 (i.e., second member 3) and the outer tube 22 (i.e., first member 2) by adjusting added amounts of the metallic particle 4c and the ceramic particle 4b.

Note that when the shapes of the inner tube 32 (i.e., second member 3) and the outer tube 22 (i.e., first member 2) are tubular, the outer diameter of the inner tube 32 (i.e., second member 3) may become larger while the inner diameter of the outer tube 22 (i.e., first member 2) may become smaller by thermal expansion. At this time, the glass layer 42 (i.e., 4) is compressed, resulting in reduction of the volume thereof. In this case, the apparent thermal expansion coefficient of the glass layer 42 (i.e., 4) may be set to be smaller than those of the inner tube 32 (i.e., second member 3) and the outer tube 22 (i.e., first member 2).

Hence, the heat transfer tube 13 is produced as follows. First, the inner tube 32 is prepared as a substrate. Then, the glass paste prepared as described in the embodiments of the present invention is coated on the outer circumferential surface of the inner tube 32. Subsequently, in the same way as in the embodiments of the present invention, the coated film is dried and then fired. In the firing step, a firing temperature is raised to be equal to the softening point $T_s$ or higher of the selected glass material so as to form the glass layer 42. The glass layer 42 thus formed has a thickness corresponding to a gap between the designed inner and outer tubes 32 and 22.

Then, the outer tube 22 is heated to raise a temperature and enlarge a diameter thereof. In this state, the inner tube 32 on which the glass layer 42 is coated is inserted into the outer tube 22. Keeping the insertion state, the glass layer 42 is heated to a temperature equal to or higher than the softening point $T_s$ of the selected glass material so as to bond the glass layer 42 to the outer tube 22. Lastly, the glass layer 42 (i.e., heat transfer tube 13) is subjected to slow cooling, thereby to produce the heat transfer tube 13 having a three-layered structure of the outer tube 22, the glass layer 42 and the inner tube 32.

Alternatively, the heat transfer tube 13 may be produced as follows. To begin with, an outer tube 22 was prepared as a substrate. Then, the glass paste prepared as in the embodiments of the present invention is coated on an inner circumferential surface of the outer tube 22. Subsequently, in the same way as mentioned above, the glass layer 42 is formed. Next, a coating layer made of a corrosion resistant alloy or ceramics is formed as the inner tube 32 on the glass layer 42 by using a deposition process such as a sputtering method, a vapor deposition method, an electroplating method, an electroless plating method or a paste application and firing method. This leads to the completion of the heat transfer tube 13 having a three-layered structure of the outer tube 22, the glass layer 42 and the inner tube 32.

In Example 2, the heat transfer tube 13 is arranged with a three-layered structure. On the contrary, a conventional heat transfer tube having a one layer structure is made of a metallic material with high corrosion resistance. However, such a metallic material has limitations on corrosion resistance so that the heat transfer tube is periodically checked and replaced with a new one during the operation. Thus, it is supposed that a structure 1, which is formed by bonding a metallic material preferred for a constructional material with a functional material such as ceramics excellent in corrosion resistance thereby to attain the preferable characteristics of both materials, is useful for constructing the heat transfer tube 13.

In this regard, the heat transfer tube 13 (i.e., structure 1) in Example 2 is configured to suppress occurrence of the thermal strain in the bonded two materials. This feature prevents the peeling-off of the bonded surfaces of the heat transfer tube 13 (i.e., structure 1).

In Example 2, the cylindrical multi-tubular typed heat exchanger 102 including the heat transfer tubes 13 (i.e., structures 1) is described. However, the structure 1 is also applicable to a plate typed heat exchanger including hollow plates instead of the above heat transfer tubes 13. That is, the first member 2 is applied to the inside of the hollow plate, while the second member 3 is applied to the outside thereof. Then, those members 1 and 2 should be bonded to each other through the glass layer 4 so as to form a structure 1.

Meanwhile, in Example 2, the heat exchanger 102 including the structure 1 is exemplified. However, the structure 1 is also applicable to plant including an apparatus such as a steam condenser or a generator provided with heat transfer members (i.e., heat transfer tubes 13) conducting heat, vessels storing high temperature substances, or tubes through which such substances flow.

Example 3

Figure 6:
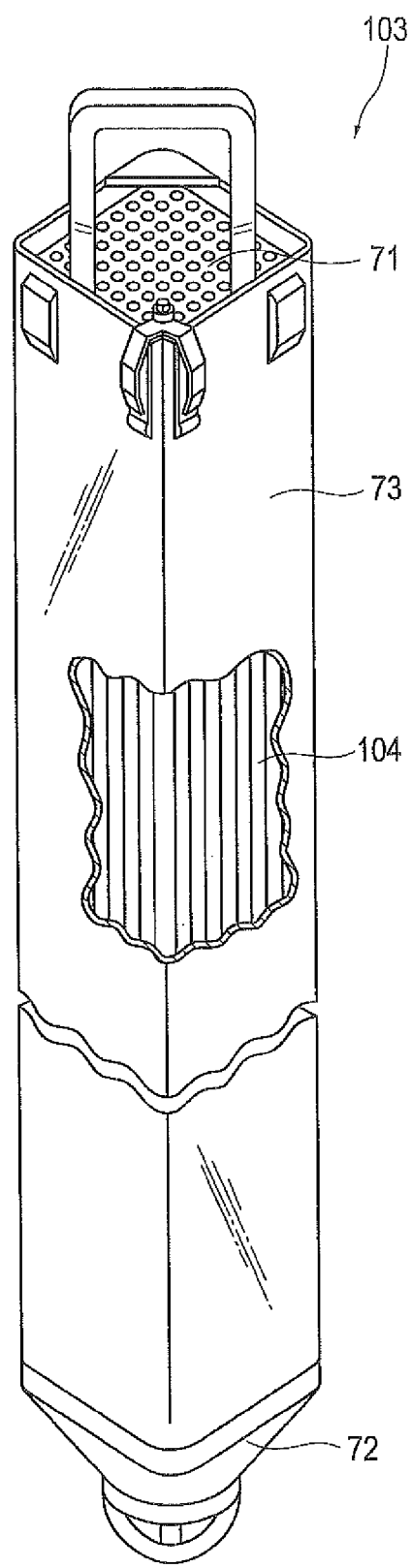
FIG. 6 is a perspective view of a fuel assembly in Example 3 of the present invention, in which a part of the fuel assembly is transparently shown.
Figure 7:
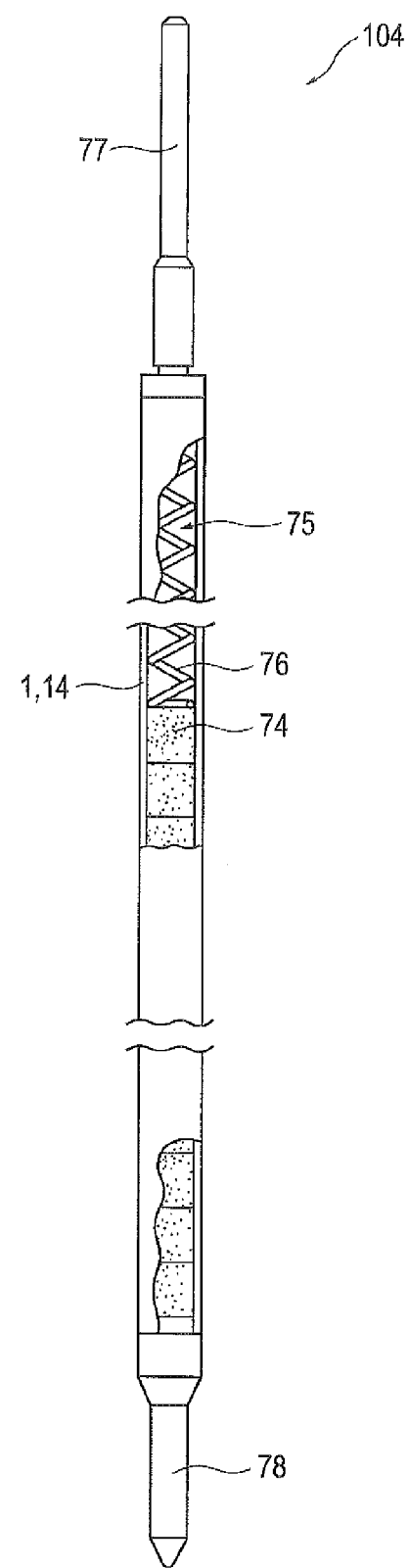
FIG. 7 is a perspective view of a fuel rod in Example 3 of the present invention, in which a part of the fuel rod is transparently shown.

FIG. 6 shows a perspective view of a fuel assembly 103 in Example 3 of the present invention. In FIG. 6, a part of the fuel assembly 103 is seen through. Further, FIG. 7 shows a perspective view of a fuel rod 104 in Example 3. In FIG. 7, a part of the fuel rod 104 is seen through. In Example 3, products incorporated with the structure 1, for example, a fuel assembly 103 used for a nuclear reactor and a fuel rod 104 incorporated in the fuel assembly 103 will be described in detail.

Here, as an example of the fuel assemblies 103, FIG. 6 shows a fuel assembly used in a light-water reactor, especially, a fuel assembly used in a Boiling Water Reactor (BWR). Further, as an example of the fuel rods 104, FIG. 7 shows a fuel rod used in a light-water reactor, especially, a fuel rod used in a Boiling Water Reactor (BWR). Note that the fuel assembly and the fuel rod used in a Pressurized Water Reactor (PWR) which is a light-water reactor are structurally similar to those used in a Boiling Water Reactor (BWR). Further, an incorporated portion of the structure 1 in the PWR is similar to that in the BWR. Thus, descriptions of the fuel assembly and the fuel rod used in the PWR will be omitted to avoid redundancy.

As shown in FIG. 6, the fuel assembly 103 has a plurality of fuel rods 104; an upper tie plate 71 to support the upper end portions of the fuel rods 104; a lower tie plate 72 to support the lower end portions of the fuel rods 104; and a channel box 73 to cover the sides of the plurality of fuel rods 104. The plurality of fuel rods 104 are vertically arranged in parallel in the fuel assembly 103 and stored therein.

As shown in FIG. 7, the fuel rod 104 has a tubular cladding tube 14 (i.e., structure 1); a lower end plug 78 which seals a lower end of the cladding tube 14 and locks the lower end to a lower tie plate 72; an upper end plug 77 which seals an upper end of the cladding tube 14 and locks the upper end to an upper tie plate 71; a plurality of pellets 74 sealed in the cladding tube 14; and a plenum spring 76 to compress the pellets 74. Note that the closed space in which the plenum spring 76 is disposed is called a plenum 75, which acts on buffering a pressure inside the cladding tube 14.

When a nuclear reactor (i.e., light-water reactor) is operated (or actuated), the pellets 74 generate heat and become high in temperature. The heated pellets 74 heat the cladding tube 14 (i.e., structure 1). In a light-water reactor, a liquid of water (light-water) or a mixture of liquid and gas (i.e., steam) of water (light-water) exists around the cladding tube 14 (i.e., fuel rods 104). For example, in a Boiling Water Reactor (BWR), high-pressure and high-temperature water in the liquid phase exists around the fuel rods 104, or a so-called two-phase state of high-pressure and high-temperature water (i.e., gas-liquid two-phase) which is a mixture of steam (i.e., gas phase) and water (i.e., liquid phase) exists around the fuel rods 104. Further, in a Pressurized Water Reactor (PWR), high-pressure and high-temperature water in the liquid phase exists around the fuel rods 104.

In short, the cladding tube 14 heats the surrounding water into high-pressure and high-temperature water. Accordingly, a nuclear power plant generates electricity by turning a turbine with the above high-pressure and high-temperature water. Here, note that a length of the cladding tube 14 is substantially 4 m and a diameter thereof is substantially 10 mm while a wall thickness thereof is substantially 1 mm.

Figure 8:
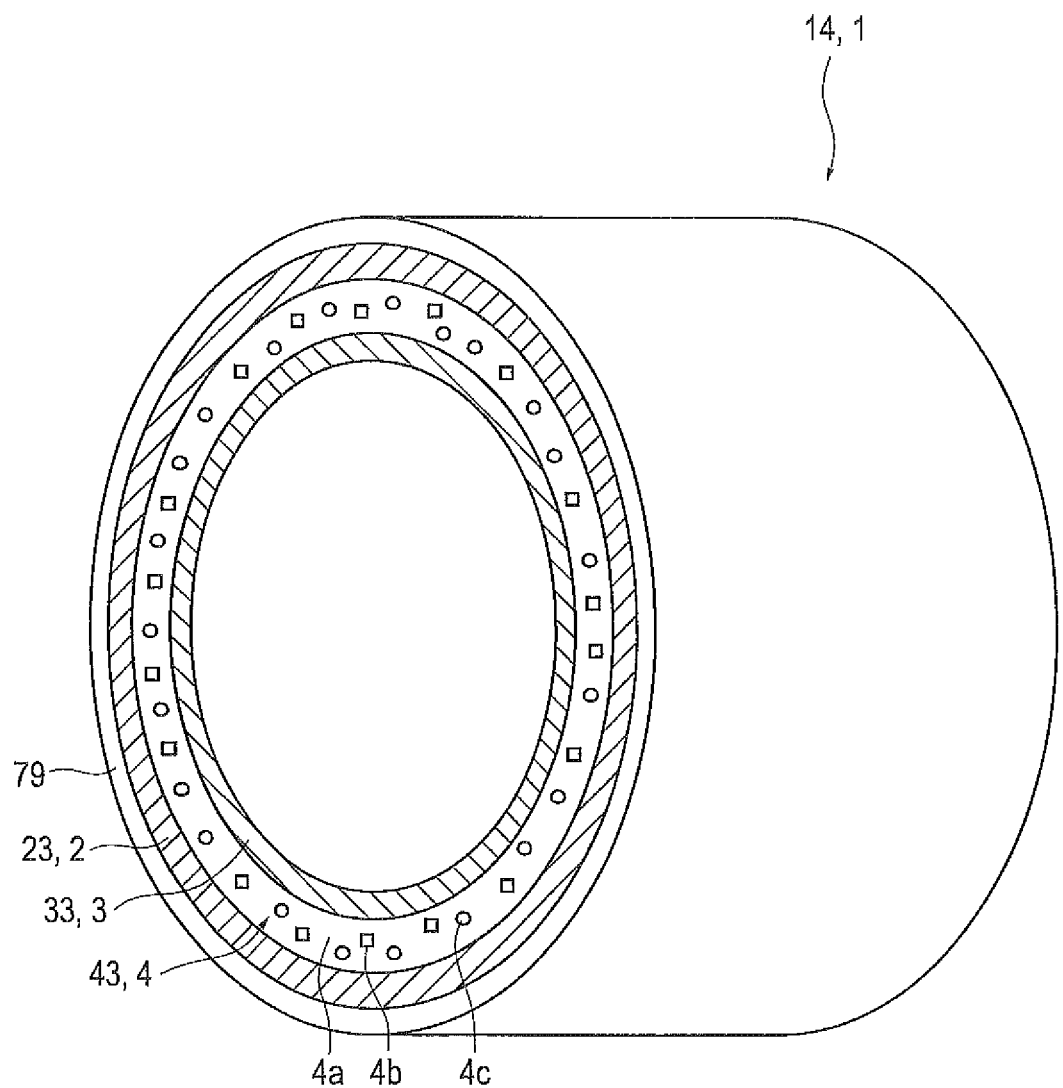
FIG. 8 is a cross-sectional perspective view of a cladding tube (i.e., structure) included in a fuel rod in Example 3 of the present invention.

FIG. 8 shows a cross-sectional perspective view of the cladding tube 14 (i.e., structure 1) applied to the fuel rod 104 in Example 3. The cladding tube 14 (structure 1) has a tubular outer tube 23 (i.e., ceramic tube corresponding to the first member 2); a tubular inner tube 33 (i.e., metallic tube corresponding to the second member 3) disposed on the inside of the outer tube 23; a glass layer 43 (i.e., 4) bonding the inside wall of the outer tube 23 to the outside wall of the inner tube 33; and an environment-resistant shield coating 79 disposed on the outside of the outer tube 23 and made of β-SiC and so forth.

In the above construction, it is supposed that the structure 1 explained in the embodiments of the present invention is realized by the laminated structure of the outer tube 23 (i.e., first member 2), the glass layer 43 (i.e., 4) and the inner tube 33 (i.e., second member 3). In other words, the cladding tube 14 (i.e., structure 1) including the laminated structure realizes the structure 1 explained in the embodiments of the present invention. Herein, the outer tube 23 is formed as a ceramic tube made of a SiC/SiC composite material. The inner tube 33 is formed as a metal tube or made of a metallic layer.

When the nuclear reactor (i.e., light-water reactor) is operated (i.e., worked), namely, when the cladding tube 14 (i.e., structure 1) is worked, in the cladding tube 14 (i.e., structure 1), heat is constantly conducted from the inner tube 33 to the outer tube 23 thereof, so that it is supposed that a temperature gradient occurs in the cladding tube 14. Thus, the temperature of the glass layer 43 (i.e., 4) when the cladding tube 14 (i.e., structure 1) is worked is estimated based on the temperatures and so forth of the fuel rods 104 and of water surrounding the rods. The glass material whose transition point $T_g$ is lower than the temperature of the glass layer 43 (i.e., 4) when the cladding tube is worked is applied to the material of the glass portion 4a of the glass layer 43 (4). Specifically, in view of the fact that the temperature under which the fuel rods 104 are worked is within the range of 290 to 350° C., it is estimated that the temperature of the glass layer 43 (i.e., 4) when the cladding tube is worked is within the range of 290 to 350° C. Hence, the glass material is selected from $V_2O_5$—$P_2O_5$—$BaO$—$TeO_2$—$Fe_2O_3$—$WO_3$ based glass materials, $V_2O_5$—$P_2O_5$—$BaO$—$TeO_2$—

$Fe_2O_3$—$WO_3$—$K_2O$ based glass materials and $V_2O_5$—$P_2O_5$—$TeO_2$—$Fe_2O_3$ based glass materials (refer to the respective corresponding columns of Table 2) each having a transition point (i.e., glass transition point) $T_g$ equal to or lower than a temperature in the range of 290 to 350° C.

Further, the glass layer 43 (i.e., 4) used for the cladding tube 14 requires higher thermal conductivity such that it readily conducts heat. Thus, the metallic particle 4c of Ag, Cu and as such and the ceramic particle 4b are dispersed in the glass layer 43 (i.e., 4) so that the thermal conductivity of the glass layer 43 is made equal to 10 W/mK or higher. Further, the apparent thermal expansion coefficient of the glass layer 42 (i.e., 4) is set to have a value between those of the inner tube 33 (i.e., second member 3) and the outer tube 23 (i.e., first member 2) by adjusting added amounts of the metallic particle 4c and the ceramic particle 4b.

Note that in the case where the inner tube 32 (i.e., second member 3) and the outer tube 22 (i.e., first member 2) are tubular in shape, there are some cases where the outer diameter of the inner tube 33 (i.e., second member 3) becomes larger while the inner diameter of the outer tube 23 (i.e., first member 2) becomes smaller associated with the thermal expansion. At this time, the glass layer 43 (i.e., 4) is compressed thereby to reduce the volume thereof. In this case, the apparent thermal expansion coefficient of the glass layer 43 (i.e., 4) may be set smaller than those of the inner tube 33 (i.e., second member 3) and the outer tube 23 (i.e., first member 2).

Further, the cladding tube 14 is produced as follows. In the first place, the outer tube 23 is prepared as a substrate. Then, the glass paste prepared as in the embodiments is coated on the inner circumferential surface of the outer tube 23. Subsequently, in the same way as explained in the embodiments of the present invention, the coated film is dried and then fired. In the firing, the glass layer 43 is formed via heating the powder of the selected glass material to the temperature equal to the softening point $T_s$ or higher.

Here, a thickness of the glass layer 43 is set ranging from 10 to 100 μm, which is defined based on the difference in the thermal expansion coefficients between the outer tube 23 and the inner tube 33. A gap between the inner and outer tubes becomes smaller as the operating temperature rises, if the thermal expansion coefficient of the inner tube 33 is larger than that of the outer tube 23. Accordingly, the thickness of the glass layer 43 is defined via estimating the contraction of the gap between the inner and outer tubes. Further, the sizes of the added ceramic particle 4b and metallic particle 4c are also defined not to inhibit the contraction of the gap.

Then, the inner tube 33 is inserted into the outer tube 23 on which the glass layer 43 is coated while diametrically enlarging the outer tube 23 by heating the outer tube 23. Keeping the inner tube inserted into the outer tube, the glass layer 43 is heated to the temperature of the softening point $T_s$ of the selected glass material or higher so as to bond the glass layer 43 to the outer circumferential surface of the inner tube 33. Lastly, the glass layer 43 (of cladding tube 14) is gradually cooled, whereby the cladding tube 14 including the three-layered structure of the outer tube 23, the glass layer 43 and the inner tube 33 is completed.

Note that for the inner tube 33, a metallic layer made of Cu, Ni, Zr and so forth or made of an alloy containing at least one of those metals may well be formed on the glass layer 43 via coating processes such as a vapor deposition method and a plating method. In this case, the thickness of such metallic layer is defined as ranging from 30 to 200 μm.

In Example 3, it is shown that the cladding tube 14 is configured as a three-layered structure. On the contrary, in the conventional technique, the cladding tube 14 having a monolayer structure is made of a Zr alloy with highly corrosion resistant. However, even such a Zr alloy still has a limit in corrosion resistance so that the cladding tubes made of the Zr alloy should be periodically checked and replaced with a new one for operation.

In this regard, it is supposed that the structure 1 formed by bonding a metallic material preferred for structural materials and a functional material such as ceramics excellent in corrosion resistance to each other so as to have the characteristics of both materials accordingly is useful for producing the cladding tube 14. Moreover, the cladding tube 14 (i.e., structure 1) in Example 3 permits the thermal strain caused by bonding two materials to each other to be reduced. This feature allows peeling off and so forth of the bonded surface derived from the thermal strain caused by the difference in the temperatures between the stopping time and the operation time to be suppressed.

Note that the present invention is not limited to the aforementioned embodiments and Example 1 to Example 3, but various modifications may be included. In other words, the aforementioned embodiments and Example 1 to Example 3 are intended only for explaining the present invention in details so that the present invention is easily understood. Therefore, the present invention is not necessarily limited to the embodiment having all the characteristic components described herein. Further, a part of the components of a certain embodiment (or example) may be replaced with that of another embodiment (or example). Moreover, a part of the components of another embodiment (or example) may be added to that of a certain embodiment (or example). Furthermore, as for a part of the components of each embodiment (or example), the components of the other embodiments may be added thereto or deleted therefrom or replaced therewith.

TABLE 1

| Materials | Thermal Expansion Coefficient (×$10^{-6}$/K) |
| --- | --- |
| Aluminum | 23 |
| Brass | 19 |
| Copper | 16.8 |
| Austenitic Stainless Steel | 17.3 |
| Gold | 14.3 |
| Iron | 12.1 |
| Nickel | 12.8 |
| Carbon Steel | 10.8 |
| Ferritic Stainless Steel | 10.4 |
| Platinum | 9 |
| Titanium | 8.6 |
| Hard Glass | 8.5 |
| Al-SiC Composite | 7.7 |
| Alumina | 7.0 |
| Zirconium | 5.7 |
| Molybdenum | 4.8 |
| SiC | 4.7 |
| SiC/SiC Composite | 4.7 |
| AlN | 4.5 |
| Tungsten | 4.3 |
| Silicon Nitride | 3.5 |
| Si | 2.4 |
| Diamond | 1.1 |

TABLE 2

| Glass Materials | Glass Transition Point (° C.) |
|---|---|
| PbO—$B_2O_3$ based glass material | 240-400 |
| $Bi_2O_3$—$B_2O_3$ based glass material | 280-470 |
| $Na_2O$—BaO—$SiO_2$ based glass material | 400-650 |
| $Al_2O_3$—$B_2O_3$—$SiO_2$ based glass material | 450-850 |
| $Na_2O$—$Al_2O_3$—$B_2O_3$—$SiO_2$ based glass material | 430-600 |
| $Na_2O$—$Al_2O_3$—$B_2O_3$—ZnO—$SiO_2$ based glass material | 470-570 |
| PbO—ZnO—$B_2O_3$ based glass material | 270-650 |
| PbO—$Al_2O_3$—$SiO_2$ based glass material | 340-650 |
| PbO—$B_2O_3$—$Al_2O_3$—$SiO_2$ based glass material | 340-600 |
| PbO—ZnO—$B_2O_3$—$SiO_2$ based glass material | 270-600 |
| ZnO—$B_2O_3$—$SiO_2$ based glass material | 300-700 |
| $V_2O_5$—$P_2O_5$—$Sb_2O_3$—BaO based glass material | 350-400 |
| $V_2O_5$—$P_2O_5$—BaO—MnO—$Fe_2O_3$—$WO_3$—$Na_2O$—$K_2O$ based glass material | 330-380 |
| $V_2O_5$—$P_2O_5$—$TeO_2$—$Fe_2O_3$ based glass material; | 250-350 |
| $V_2O_5$—$P_2O_5$—BaO—$TeO_2$—$Fe_2O_3$—$WO_3$ based glass material | 250-300 |
| $V_2O_5$—$P_2O_5$—BaO—$TeO_2$—$Fe_2O_3$—$WO_3$—$K_2O$ based glass material | 250-300 |
| $V_2O_5$—$TeO_2$—$Ag_2O$ based glass material | 150-250 |

LIST OF REFERENCE SIGNS 1 structure
2 first member (i.e., film)
3 second member
4 glass layer
4a glass portion
4b ceramic particle
4c metallic particle
11 smaller structure in electronic element module (i.e., structure)
12 larger structure in electronic element module (i.e., structure)
13 heat transfer tube (i.e., structure)
14 cladding tube (i.e., structure)
21a electronic element (i.e., LED, IGBT: first member)
21b wiring circuit board (i.e., first member)
22 outer tube (i.e., first member)
23 ceramic tube (i.e., first member, outer tube)
31a wiring circuit board (i.e., second member)
31b heat dissipating substrate (i.e., second member)
32 inner tube (i.e., second member)
33 metallic tube (i.e., second member, inner tube)
41a, 41b glass layer
42 glass layer
43 glass layer
67 first fluid
68 second fluid
74 pellet
101 electronic element module
102 heat exchanger
103 fuel assembly
104 fuel rod
$T_g$ transition point (glass transition point)
$T_x$ temperature under which structure is worked
$T_s$ softening point

The invention claimed is:

1. A structure comprising:
a first member;
a second member disposed opposite to the first member; and
a glass layer disposed between the first member and the second member and so as to bond the first member and the second member,
wherein a glass transition point of the glass layer is lower than a temperature of the glass layer when the structure is operated; and
a softening point of the glass layer is higher than the temperature of the glass layer when the structure is operated.

2. The structure according to claim 1, wherein at least either of ceramic and metallic particles is dispersed in the glass layer.

3. The structure according to claim 1,
wherein a material of the glass layer is at least one member selected from a PbO—$B_2O_3$ based glass material; a $Bi_2O_3$—$B_2O_3$ based glass material; a $Na_2O$—BaO—$SiO_2$ based glass material; an $Al_2O_3$—$B_2O_3$—$SiO_2$ based glass material; a $Na_2O$—$Al_2O_3$—$B_2O_3$—$SiO_2$ based glass material; a $Na_2O$—$Al_2O_3$—$B_2O_3$—ZnO—$SiO_2$ based glass material; a PbO—ZnO—$B_2O_3$ based glass material; a PbO—$Al_2O_3$—$SiO_2$ based glass material; a PbO—$B_2O_3$—$Al_2O_3$—$SiO_2$ based glass material; a PbO—ZnO—$B_2O_3$—$SiO_2$ based glass material; a ZnO—$B_2O_3$—$SiO_2$ based glass material; a $V_2O_5$—$P_2O_5$—$Sb_2O_3$—BaO based glass material; a $V_2O_5$—$P_2O_5$—BaO—MnO—$Fe_2O_3$—$WO_3$—$Na_2O$—$K_2O$ based glass material; a $V_2O_5$—$P_2O_5$—$TeO_2$—$Fe_2O_3$ based glass material; a $V_2O_5$—$P_2O_5$—BaO—$TeO_2$—$Fe_2O_3$—$WO_3$ based glass material; a $V_2O_5$—$P_2O_5$—BaO—$TeO_2$—$Fe_2O_3$—$WO_3$—$K_2O$ based glass material; and a $V_2O_5$—$TeO_2$—$Ag_2O$ based glass material.

4. The structure according to claim 1, wherein the first member is a film formed on the glass layer.

5. The structure according to claim 4, wherein the film is formed by means of at least one of a sputtering method, a vapor deposition method, a plating method and a coating method.

6. The structure according to claim 1, wherein a thermal expansion coefficient of the glass layer has a value between thermal expansion coefficients of the first and second members in a temperature region lower than the glass transition point.

7. An electronic element module including the structure according to claim 1,
wherein the first member is either an electronic element or a support member for supporting the electronic element;

the second member is a substrate; and ceramic and metallic particles are dispersed in the glass layer such that thermal conductivity of the glass layer is equal to 25 W/mK or higher and electric resistance of the glass layer is equal to 0.1 mΩ/cm² or lower.

8. A heat exchanger including the structure according to claim 1, through the heat exchanger first and second fluids at different temperatures to each other flowing while isolated by the structure, wherein the first member is disposed on the glass layer at a side of the first fluid;

the second member is disposed on the glass layer at a side of the second fluid;

at least either of ceramic and metallic particles is dispersed in the glass layer; and thermal expansion conductivity of the glass layer is equal to 22 W/mK or higher.

9. A fuel rod including the structure according to claim 1 as a cladding tube that stores pellets, wherein the first member is a ceramic tube disposed on an outer circumferential side of the cladding tube;

the second member is a metallic tube disposed on an inner circumferential side of the cladding tube; and at least either of ceramic and metallic particles is dispersed in the glass layer such that thermal expansion conductivity of the glass layer is equal to 10 W/mK or higher.

10. A fuel assembly storing a plurality of the fuel rods according to claim 9.

* * * * *